(12) United States Patent
Zuniga et al.

(10) Patent No.: US 11,931,857 B2
(45) Date of Patent: Mar. 19, 2024

(54) DEFORMABLE SUBSTRATE CHUCK

(71) Applicant: Applied Materials, Inc., Santa Clara, CA (US)

(72) Inventors: Steven M. Zuniga, Soquel, CA (US); Jay Gurusamy, Santa Clara, CA (US); Andrew J. Nagengast, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 154 days.

(21) Appl. No.: 17/350,579

(22) Filed: Jun. 17, 2021

(65) Prior Publication Data

US 2021/0402557 A1    Dec. 30, 2021

Related U.S. Application Data

(60) Provisional application No. 63/045,023, filed on Jun. 26, 2020.

(51) Int. Cl.
*B24B 37/30* (2012.01)
*B24B 37/04* (2012.01)
(Continued)

(52) U.S. Cl.
CPC ............ *B24B 37/30* (2013.01); *B24B 37/042* (2013.01); *B24B 49/12* (2013.01);
(Continued)

(58) Field of Classification Search
None
See application file for complete search history.

(56) References Cited

U.S. PATENT DOCUMENTS 5,588,902 A * 12/1996 Tominaga ............... B24B 37/30
                                                         451/288
5,681,215 A * 10/1997 Sherwood ............... B24B 37/32
                                                         451/388
(Continued)

FOREIGN PATENT DOCUMENTS

CN     201446411     12/2014
CN     108604543     9/2018
(Continued)

OTHER PUBLICATIONS

International Search Report and Written Opinion in International Appln. No. PCT/US2021/037838, dated Sep. 24, 2021, 10 pages.
(Continued)

*Primary Examiner* — Don M Anderson
*Assistant Examiner* — Jonathan R Zaworski
(74) *Attorney, Agent, or Firm* — Fish & Richardson P.C.

(57) ABSTRACT

A carrier head includes a housing, a support assembly having a support plate flexibly connected to the housing so as to be vertically movable, a plurality of fluid-impermeable barriers projecting from a bottom of the support plate to define a plurality of recesses that are open at bottom sides thereof, and pneumatic control lines. A volume between the support plate and the housing includes one or more independently pressurizable first chambers to apply pressure on a top surface of the support plate in one or more first zones. The barriers are positioned and configured such that when a planar substrate is loaded into the carrier head the barriers contact the substrate and divide a volume between the support plate and the substrate into a plurality of second chambers. The pneumatic control lines are coupled to the plurality of recesses to provide a plurality of independently pressurizable second zones.

16 Claims, 3 Drawing Sheets

(51) Int. Cl.
    *B24B 49/12*          (2006.01)
    *H01L 21/3105*     (2006.01)
    *H01L 21/321*      (2006.01)
    *H01L 21/66*        (2006.01)
    *H01L 21/67*        (2006.01)
    *H01L 21/683*      (2006.01)

(52) U.S. Cl.
    CPC .... *H01L 21/31053* (2013.01); *H01L 21/3212* (2013.01); *H01L 21/67253* (2013.01); *H01L 21/6838* (2013.01); *H01L 22/26* (2013.01)

(56) References Cited

U.S. PATENT DOCUMENTS

| | | | | |
|---|---|---|---|---|
| 5,762,539 | A * | 6/1998 | Nakashiba | B24B 49/16 451/286 |
| 5,795,215 | A * | 8/1998 | Guthrie | B24B 37/32 451/286 |
| 5,916,016 | A * | 6/1999 | Bothra | B24B 37/30 451/388 |
| 5,993,293 | A * | 11/1999 | Cesna | B24B 37/32 451/63 |
| 6,024,630 | A * | 2/2000 | Shendon | B24B 37/32 451/286 |
| 6,080,050 | A * | 6/2000 | Chen | B24B 37/30 451/388 |
| 6,390,905 | B1 * | 5/2002 | Korovin | B24B 37/30 451/286 |
| 6,431,968 | B1 * | 8/2002 | Chen | B24B 37/30 451/288 |
| 6,443,821 | B1 * | 9/2002 | Kimura | B24B 37/32 451/41 |
| 6,471,571 | B2 * | 10/2002 | Oliver | B24B 41/061 451/287 |
| 6,494,774 | B1 * | 12/2002 | Zuniga | B24B 37/30 451/41 |
| 6,558,232 | B1 * | 5/2003 | Kajiwara | B24B 49/16 451/41 |
| 6,722,965 | B2 * | 4/2004 | Zuniga | B24B 37/30 451/41 |
| 6,769,973 | B2 * | 8/2004 | Boo | B24B 41/061 451/41 |
| 6,852,019 | B2 * | 2/2005 | Togawa | B24B 41/061 451/388 |
| 6,926,585 | B2 * | 8/2005 | Togawa | B24B 49/16 451/6 |
| 6,957,998 | B2 * | 10/2005 | Togawa | B24B 53/017 451/388 |
| 6,979,250 | B2 * | 12/2005 | Zuniga | B24B 37/30 451/388 |
| 7,014,535 | B2 * | 3/2006 | Custer | B24B 37/30 438/689 |
| 7,033,260 | B2 * | 4/2006 | Togawa | B24B 41/061 451/388 |
| 7,044,838 | B2 * | 5/2006 | Maloney | B24B 49/16 451/63 |
| 7,083,507 | B2 * | 8/2006 | Togawa | B24B 37/30 451/388 |
| 7,140,956 | B1 * | 11/2006 | Korovin | B24B 41/061 451/286 |
| 7,207,871 | B1 * | 4/2007 | Zuniga | B24B 49/16 451/388 |
| 7,303,466 | B2 * | 12/2007 | Boo | B24B 37/30 451/288 |
| 7,491,117 | B2 * | 2/2009 | Togawa | B24B 37/30 451/388 |
| 7,497,767 | B2 * | 3/2009 | Chen | B24B 37/30 451/288 |
| 7,850,509 | B2 * | 12/2010 | Togawa | B24B 37/30 451/388 |
| 9,011,207 | B2 * | 4/2015 | Duescher | B24B 37/042 451/41 |
| 9,610,672 | B2 * | 4/2017 | Oh | B24B 37/11 |
| 11,511,389 | B2 * | 11/2022 | Akazawa | B24B 41/06 |
| 2002/0039879 | A1 * | 4/2002 | Zuniga | B24B 37/30 451/288 |
| 2003/0073381 | A1 | 4/2003 | Mallery et al. | |
| 2004/0087254 | A1 * | 5/2004 | Shendon | B24B 37/32 451/41 |
| 2005/0272346 | A1 * | 12/2005 | Boo | B24B 37/30 451/6 |
| 2007/0167110 | A1 * | 7/2007 | Tseng | B24B 37/30 451/5 |
| 2013/0273812 | A1 * | 10/2013 | Qian | B24B 49/04 451/5 |
| 2014/0027407 | A1 * | 1/2014 | Deshpande | B24B 37/30 216/53 |
| 2014/0170938 | A1 * | 6/2014 | Duescher | B24B 37/042 451/41 |
| 2016/0193712 | A1 * | 7/2016 | Komura | B24B 37/30 451/287 |
| 2019/0047117 | A1 * | 2/2019 | Watanabe | B24B 37/013 |

FOREIGN PATENT DOCUMENTS

| | | |
|---|---|---|
| CN | 109641342 | 4/2019 |
| CN | 110900436 | 3/2020 |
| EP | 1048408 | 11/2000 |
| JP | 2015-168015 | 9/2015 |
| WO | WO 2002/04172 | 1/2002 |

OTHER PUBLICATIONS

Office Action in Chinese Appln. No. 202180014741.3, dated Aug. 3, 2023, 14 pages (with English translation).

Office Action in Japanese Appln. No. 2022-544713, dated Aug. 29, 2023, 12 pages (with English translation).

* cited by examiner

# DEFORMABLE SUBSTRATE CHUCK

CROSS-REFERENCE TO RELATED APPLICATIONS

This application claims priority to U.S. Application Ser. No. 63/045,023, filed on Jun. 26, 2020, the disclosure of which is incorporated by reference.

TECHNICAL FIELD

This invention relates to a carrier head for use in chemical mechanical polishing (CMP).

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

SUMMARY

In one aspect, a carrier head includes a housing, a support assembly having a support plate flexibly connected to the housing so as to be vertically movable relative to the housing, a plurality of fluid-impermeable barriers projecting from a bottom of the support plate to define a plurality of recesses that are open at bottom sides thereof, and pneumatic control lines. A volume between the support plate and the housing includes one or more independently pressurizable first chambers to apply pressure on a top surface of the support plate in one or more first zones. The barriers are positioned and configured such that when a planar substrate is loaded into the carrier head the barriers contact the substrate and divide a volume between the support plate and the substrate into a plurality of second chambers. The pneumatic control lines are coupled to the plurality of recesses to provide a plurality of independently pressurizable second zones.

Possible advantages may include, but are not limited to, one or more of the following. A deformable substrate chuck can provide an additional process tuning parameter and improve pressure resolution, as a plurality of micro-zones can use pressures and vacuums to control a substrate shape (e.g., control the degree of flex or bend in the substrate), and one or more macro-zones can apply polishing pressure to the substrate.

The deformable substrate chuck can improve within-wafer uniformity by distributing pressure across the substrate according to a substrate's shape and polishing pad stiffness, e.g., by increasing applied pressure at portions of the substrate that require additional pressure and by decreasing applied pressure at portions of the substrate that require less pressure. Additionally, because pressure is distributed according to a substrate's shape and polishing pad stiffness, wafer-to-wafer uniformity can be improved by tailoring the polishing profile applied to each substrate. In-situ metrology can be used to measure the shape of the substrate, and this data can be used as feedback to a controller to adjust pressure to achieve a target shape.

DETAILED DESCRIPTION

Some polishing processes result in thickness non-uniformity across the surface of the substrate. One cause of non-uniformity is variation in the shape of the substrate. Even assuming that the substrate being polished has a uniform thickness, it is possible for the substrate as a whole to be non-planar, e.g., have concave or convex bow or be curved like a potato-chip. This curvature can be slight, e.g., up to tens of microns, but occurs at a much larger scale than the structures being fabricated, e.g., across a lateral distance of 1-10 cm. When such a non-planar substrate is pressed against the polishing pad, the "peaks" of the substrate provided by the bow or undulations press harder against the polishing pad and thus experience higher pressure during polishing. Therefore, even if uniform pressure is applied by the carrier head to the backside of the wafer, some regions of the substrate can be polished at a higher rate, leading to these regions being over-polished.

To address this problem, a "shape-based" approach can be used to distribute pressure according to a substrate shape and a polishing support pad stiffness. One or more macro-zones can be used to apply pressure to a polishing support pad, and a plurality of micro-zones with pressure and vacuum inputs can be used to control the shape of the substrate.

Figure 1:
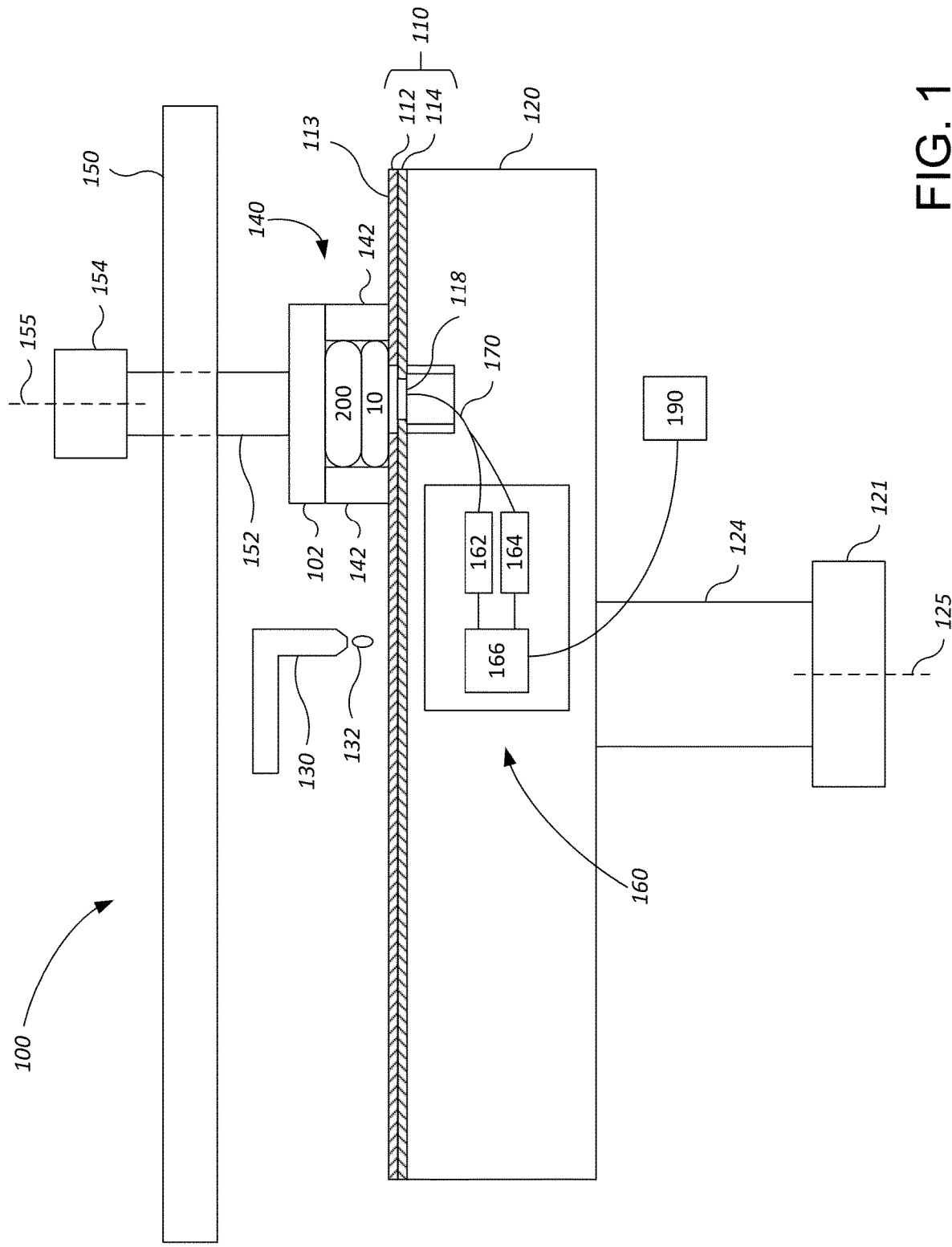
FIG. 1 is a schematic cross-sectional view of a polishing system.

FIG. 1 illustrates an example of a polishing system 100 that includes one or more carrier heads 140 (only one shown). Each carrier head 140 is operable to hold a substrate 10, such as a wafer, against the polishing pad 110 for polishing. Each carrier head 140 can have independent control of the polishing parameters, for example pressure, associated with each respective substrate.

Each carrier head 140 is suspended from a support structure 150, e.g., a carousel or a track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by motion of a carriage that supports the carrier head 140 along the track.

The platen 120 included in the polishing system 100 is a rotatable disk-shaped platen on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 with a polishing surface 113 and a softer backing layer 114.

The polishing system 100 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state. Conditioning can also wear the polishing pad at a consistent rate.

In operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

In some implementations, the polishing apparatus includes an in-situ monitoring system 160. The in-situ monitoring system can be an optical monitoring system, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118. The in-situ monitoring system can alternatively or in addition include an eddy current monitoring system.

In some implementation, the monitoring system 160 is an in-sequence optical monitoring system having a probe (not shown) positioned between two polishing apparatuses or between a polishing apparatus and a transfer station. The monitoring system 160 can continuously or periodically monitor one or more features of the zones of the substrate during polishing. For example, one feature is a thickness of each zone of the substrate.

In either the in-situ or in-sequence embodiments, the monitoring system 160 can include a light source 162, a light detector 164, and circuitry 166 for sending and receiving signals between a remote controller 190, e.g., a computer, and the light source 162 and light detector 164. One or more optical fibers 170 can be used to transmit the light from the light source 162 to the optical access in the polishing pad, and to transmit light reflected from the substrate 10 to the detector 164.

Figure 2:
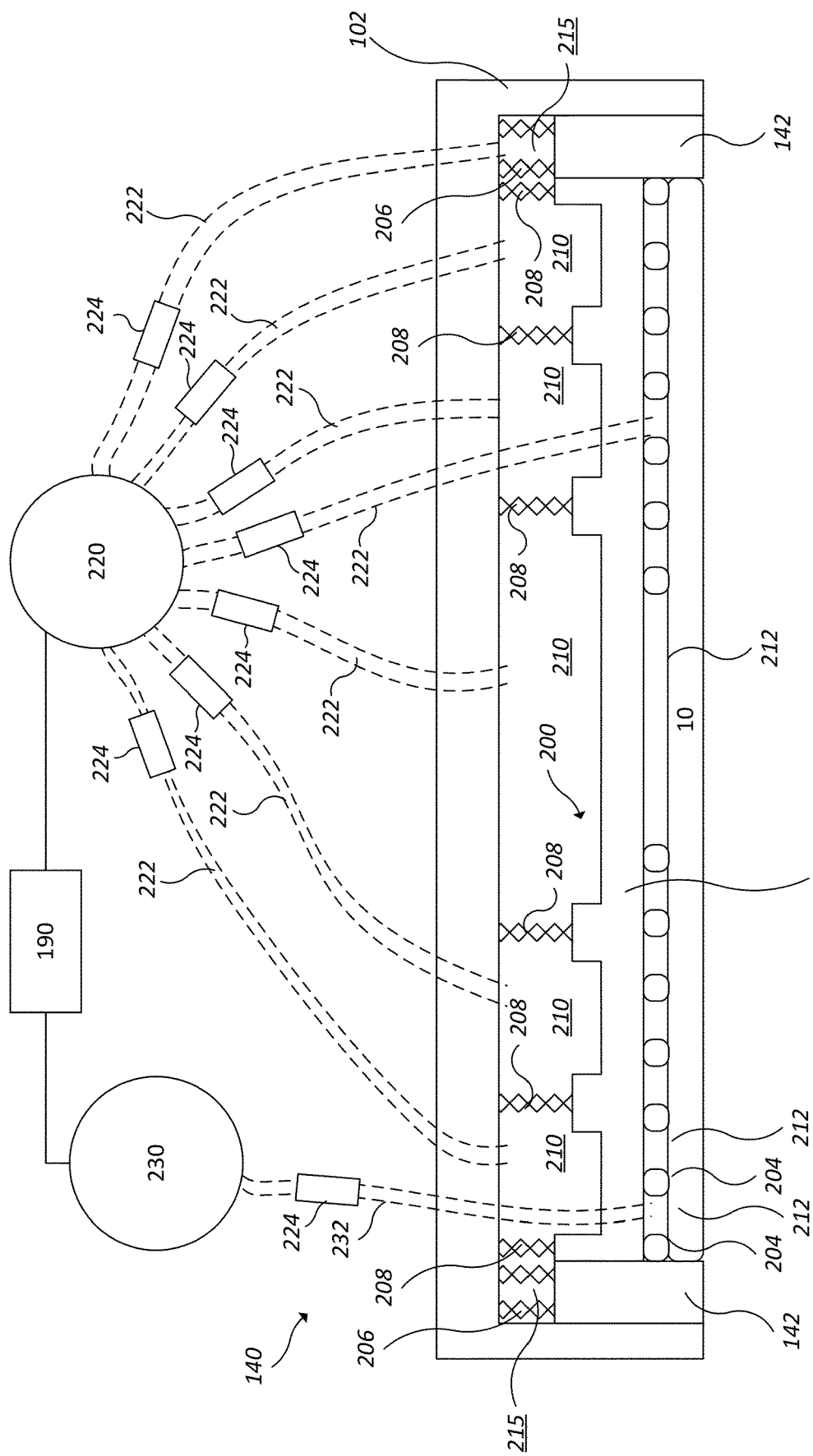
FIG. 2 is a schematic cross-sectional view of a carrier head.

Referring to FIGS. 1-2, the carrier head 140 includes a housing 102, a retaining ring 142, and a support assembly 200 within the housing 102.

The retaining ring 142 is configured to retain the substrate 10 below the support assembly 200. The retaining ring 142 can be a floating retaining ring that is vertically movably connected to the housing 102. A seal 206, e.g., an annular flexure, rolling diaphragm, or bellows, can be used to both connect the retaining ring 142 to the housing 102 and to form a pressurizable chamber 215 that permits control of the vertical position of and downward pressure on the retaining ring 142. The pressurizable chamber 215 can be connected to an independently controllable pressure source 220. For example, a valve 224 on each channel 222 can regulate the flow of gas flowing into the pressurizable chamber 215.

The support assembly 200 includes a support plate 202. The support plate 202 can be sufficiently wide to span the entirety of the substrate 10. If the support plate is too flexible, the support plate cannot enforce a shape change on the substrate. But if the support plate is too stiff, the response to a backside pressure distribution is too muted. An optimum stiffness for the support plate 202 is a trade-off between shape controllability and applied pressure resolution.

The volume between the housing 102 and the support plate 202 is divided into a plurality of upper chambers 210 by one or more flexible fluid-impermeable first barriers 208, e.g., annular flexures, rolling diaphragms, or bellows. The first barriers 208 can permit the support plate 202 to move vertically relative to the housing 102. The first barriers 208 can also serve to secure the support plate 202 to the housing 102, although a flange projecting inwardly from the housing or other mechanism can be used to limit downward motion of support plate 202 and/or prevent over-extension of the flexible barriers 208. There can be 1 to 10 upper chambers 210. The number of upper chambers can depends on the stiffness of the support plate 202. In general, the stiffer the plate, the fewer upper chambers are needed. For a rigid support plate, 1 or 2 upper chambers can be adequate. The upper chambers 210 can be pressurized using one or more pressure sources 220 via channels 222. Each upper chamber 210 can be connected to an independently controllable pressure source 220. For example, a pressure regulator 224 on each channel 222 can regulate the pressure in each upper chamber 210.

A plurality of fluid-impermeable second barriers 204 can be secured to a bottom face of the support plate 202. The second barriers 204 can extend generally vertically down from the bottom face of the support plate 202, e.g., at a right angle from the support plate 202. The gaps between the second barriers below the support plate 202 define recesses that are open at the bottom end thereof.

In some implementations, the second barriers 204 extend down from a backing membrane that is formed of the same material as the second barriers 204. The back surface of the membrane can abut and be attached to the support plate, e.g., by an adhesive, or by a mechanical fixtures such as a clamp. The second barriers 205 can be provided by a single molded part, e.g., as a ridges that extend downwardly from the backing membrane or as an interconnected mesh, which does not need the backing membrane. Alternatively, the second barriers 204 can be provided separate pieces that are independently secured to the support plate 202.

The fluid-impermeable second barriers 204 can be soft and compressible. For example, the fluid-impermeable second barriers 204 can be formed of a material with a hardness of 30-60 Shore A, and/or with an elastic modulus less than 50 MPa. The second barrier 204 can be an elastomer, e.g., a thermoplastic elastomer. The second barrier can be a rubber material, such as silicone rubber. In some implementations, the second barriers are more elastic and/or more compressible than the support plate 202.

Although the second barriers 204 are soft and compressible, three configurations for the carrier head 140 are possible depending on the flexural stiffness of the support plate 202, each having an associated operational mode.

First, the carrier head 140 can be used to vacuum chuck the substrate without substrate deformation but with an applied pressure distribution. In this case, a compliant sealing layer and a compliant support plate 202 can be used.

This can be termed a compliant/compliant combination. In this case, the flexural stiffness of the support plate 202 can be in the range of 0.1 to 1 times the flexural stiffness of the substrate.

Second, the carrier head 140 can be used to vacuum chuck the substrate with substrate deformation and with an applied pressure distribution. In this case, a compliant sealing layer and a semi-rigid support plate 202 can be used. This can be termed a semi-rigid/compliant combination. In this case, the flexural stiffness of the support plate 202 can be in the range of 1 to 25 times the flexural stiffness of the substrate. If the support plate 202 is too rigid, then the support plate 202 cannot apply a pressure distribution to the backside of the substrate in manner that the pressure distribution will be transferred to the frontside of the substrate.

For example, the support plate 202 can be made of metal, e.g., stainless steel, or a plastic, e.g., polyetheretherketone (PEEK). To achieve the flexural stiffness described above, a support plate formed of PEEK can have a thickness between about 2.5 mm and 7.0 mm, whereas a support plate formed of stainless steel can have a thickness between about 0.6 mm and 1.8 mm. If the support plate is used just for chucking the substrate and not to deform the substrate, then the support plate can be much more flexible, e.g., 0.01 to 1.0 times the stiffness of substrate. To achieve the flexural stiffness described above, a support plate formed of PEEK can have a thickness between about 0.5 mm and 2.5 mm Third, the carrier head 140 can be used to vacuum chuck the substrate with substrate deformation but without an applied pressure distribution. In this case, a compliant sealing layer and rigid support plate 202 can be used. In this last case, a uniform pressure is applied to the support plate 202. This can be termed a rigid/compliant combination. In this case, the flexural stiffness of the support plate 202 can be at least 25 times the flexural stiffness of the substrate.

Flexural stiffness (or rigidity), can calculated $D=Et^3/12*(1-nu^2)$, where E is the flexural modulus, t is the thickness, and nu is Poisson's ratio. To a first approximation the flexural stiffness of the substrate is dominated by the flexural stiffness of the underlying silicon wafer. A 300 mm diameter wafer has a Young's modulus of 112 GPa. Thus, in the compliant/compliant combination, the support plate 202 can have a flexural stiffness of about 0.02 to 0.40 Pa·m³. In the semi-rigid/compliant combination, the support plate 202 can have a flexural stiffness of about 0.4 to 10 Pa·m³. In the rigid/compliant combination, the support plate 202 can have a flexural stiffness greater than 10 Pa·m³.

When the second barriers 204 contact the substrate, the barriers can form fluid-tight seals that separate the volume between the support plate 202 and the substrate 10 into a plurality of lower chambers 212, each lower chamber 212 corresponding to one of the recesses. The lower chambers 212 can be depressurized to chuck the substrate 10 to the carrier head 140.

The second barriers 204 separate the volume between the support plate 202 and the substrate 10 into a plurality of lower chambers 212. There can be 2 to 100 second barriers 204 secured to the support plate 202. In particular, the region below each upper chamber 210 can be divided into multiple lower chamber 212, e.g., 2 to 10 lower chambers 212. So at least some second barriers 204 are located laterally between (although vertically below) the adjacent first barriers 202 that define an upper chamber. The second barriers 204 can be annular. The second barriers 204 can be spaced 2 to 100 mm apart. A central lower chamber below the support plate 202 can be 20 to 200 mm in diameter. For example, if there is a single large central zone and a single narrow outer zone, then the central zone can be 200 mm in diameter and the outer zone can have a width of 50 mm (for a 300 mm diameter substrate). On the other hand, for 10 lower chambers 212, the central zone can be 60 mm in diameter and the remaining chambers can have a width of 30 mm each. Of course other configurations are possible, e.g., the lower chambers can be progressively narrower toward the outer edge of the carrier head.

Figure 3A:
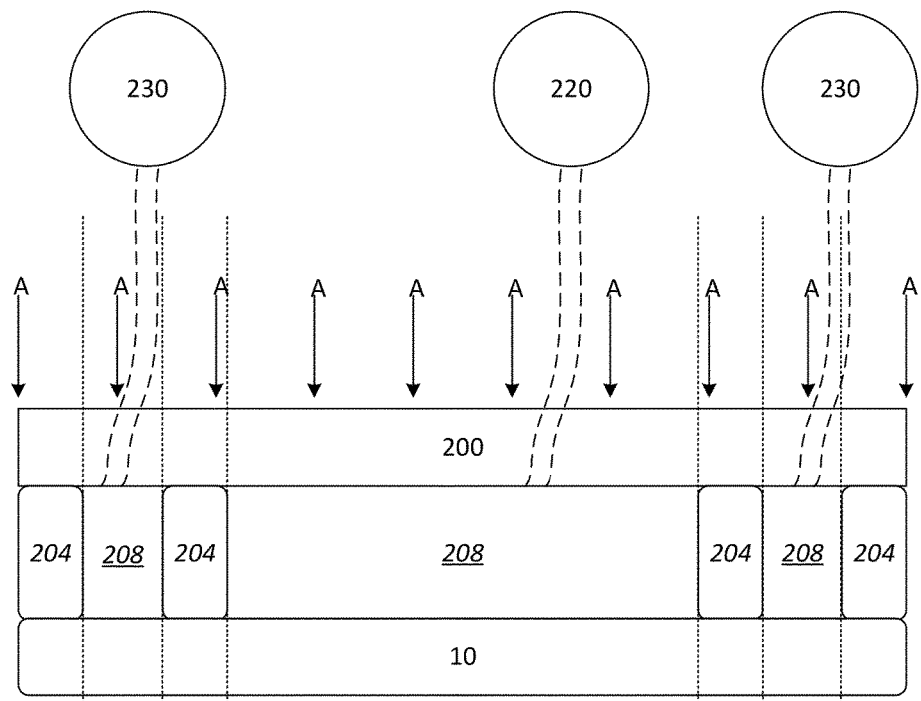
FIG. 3A is a schematic cross-sectional view of a support assembly and substrate.
Figure 3B:
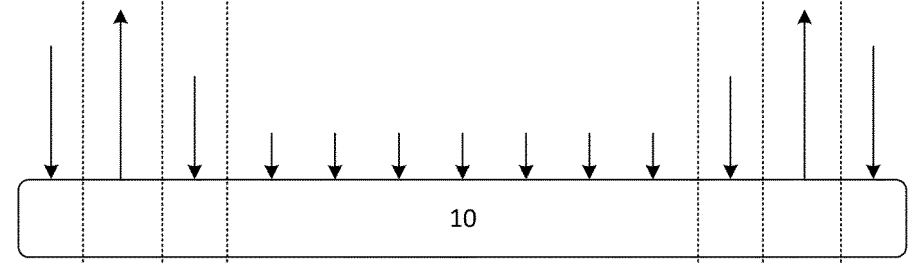
FIG. 3B is a schematic cross-sectional view of the forces applied by the support assembly to the substrate of FIG. 3A.
Figure 3C:
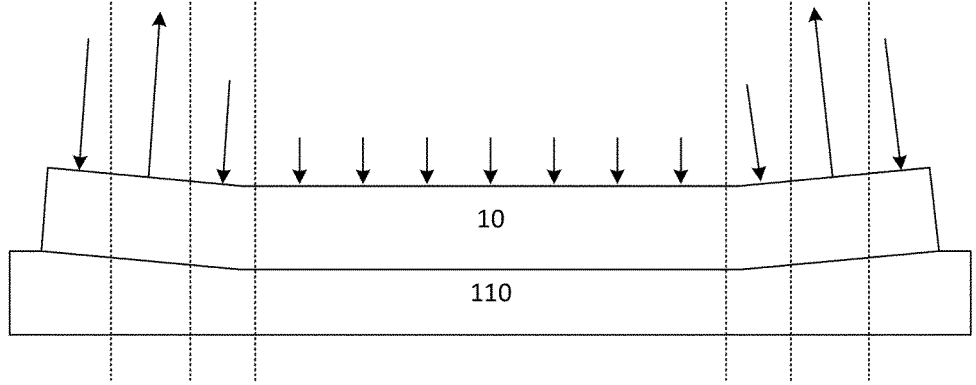
FIG. 3C is a schematic cross-sectional view of the deformed substrate of FIG. 3B on a polishing pad.

Referring also to FIGS. 3A-3C, the one or more lower chambers 212 can be pressurized or depressurized using one or more pressure sources 220 via channels 222. Each lower chamber 212 can be connected to an independently controllable pressure source 220. For example, a valve or pressure regulator 224 on each channel 222 can regulate the flow of gas going into each lower chamber 212. While only one micro-zone 212 is shown connected to the pressure source 220, each lower chamber 212 can be connected to a respective independently controllable pressure source 220. However, in some implementations, multiple lower chambers, e.g., a group of adjacent lower chambers 212, can be connected to a common pressure source 220. In this case, the second barriers 204 can provide support for the substrate when the substrate is chucked against the second barriers 204.

The one or more lower chambers 212 can be depressurized using one or more vacuum sources 230 via vacuum channels 232. Each lower chamber 212 can be connected to an independently controllable vacuum source 230. For example, a valve 234 on each vacuum channel 232 can regulate the flow of gas suctioned or vacuumed out of each lower chamber 212. While only one lower chamber 212 is shown connected to the vacuum source 230, it is understood that each lower chamber 212 can be connected to a vacuum source 230.

Depressurizing one or more of the lower chambers 212 can create a vacuum in the corresponding lower chamber 212 and chuck the substrate 10 to the support plate 202 in the carrier head 140.

In the semi-rigid/compliant and rigid/compliant configurations of the carrier head, the lower chambers 212 can be controlled to deform the substrate 10. For example, the support plate has sufficient rigidity that depressurizing some of the lower chambers 212 and simultaneously pressurizing other lower chambers 212 can cause the substrate to bend (with the support plate 202 bending less than the substrate, depending on the relative flexural stiffness).

In the compliant/compliant and semi-rigid/compliant configurations of the carrier head, the macro-zones 210 can be pressurized by the pressure source 220 to different pressures to apply different polishing pressures to different regions of the substrate 10. In particular, the support plate 202 can bend slightly based on the applied pressure in the macro-zones, and this pressure difference being transferred to the substrate through the second barriers 204. If the support plate 202 is too rigid, then any pressure differentials from the macro-zones 210 will be smoothed out by the support plate 202.

In some implementations, the lower chambers 212 are pressurized such that there is a net zero down force on the substrate.

In-situ metrology can be used to measure the shape of the substrate, and this data can be used as feedback to a controller to adjust pressure to achieve a target shape. Referring to FIG. 1, the monitoring system 160 can be used to measure the shape of the substrate 10. For example, the deformation of the substrate relative to a reference shape can be measured. The measurements can be sent to the controller 190, which can then control the one or more pressure sources 220 and/or the one or more vacuum sources 230 to pressurize and/or depressurize the lower chambers 212 to deform the substrate 10 for polishing. Note that either pressure or vacuum could be used deform the substrate 10. In some implementations, a nominal vacuum can be applied to all lower chambers 212 (to secure the substrate) and a "higher" vacuum, i.e., even lower pressure, can be applied to specific lower chambers to deform the substrate 10.

The controller and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of embodiments of the invention have been described. Nevertheless, it will be understood that various modifications may be made. For example:

The lower chambers can be larger or smaller than the upper chambers.

The seals need not be concentric. For example, the seals can form pie-shaped zones.

The seal and support plate can be formed from a single molded body, e.g., a thermoplastic elastomer (TPE).

Accordingly, other implementations are within the scope of the following claims.

What is claimed is:

1. A carrier head, comprising:
   a housing,
   a support assembly having a support plate flexibly connected to the housing so as to be vertically movable relative to the housing;
   at least one upper barrier that divides a volume between the support plate and the housing into a plurality of independently pressurizable first chambers to apply pressure on a top surface of the support plate in one or more first zones;
   a plurality of fluid-impermeable barriers projecting from a bottom of the support plate to define a plurality of recesses that are open at bottom sides thereof, wherein a region below each first zone is divided by the fluid-impermeable barriers into a plurality of second zones with each second zone corresponding to a recess from the plurality of recesses, and wherein the barriers are positioned and configured such that when a planar substrate is loaded into the carrier head the barriers contact the substrate and divide a volume between the support plate and the substrate into a plurality of second chambers with each second zone corresponding to a second chamber from the plurality of second chambers and at least one second zone of the plurality of second zones being entirely below an associated first zone of the plurality of first zones; and
   pneumatic control lines coupled to the plurality of recesses such that the plurality of second chambers are independently pressurizable.

2. The carrier head of claim 1, wherein at least one second zone includes a plurality of recesses with pressure in second chambers defined by the plurality of recesses commonly controlled by a pneumatic control line.

3. The carrier head of claim 2, wherein at least one second zone of the plurality of the second zones includes a plurality of recesses pressure in second chambers defined by the plurality of recesses of a respective zone commonly controlled by a pneumatic control line for the respective zone.

4. The carrier head of claim 2, wherein the second zone includes 4 to 100 recesses.

5. The carrier head of claim 1, wherein the second zones are narrower than the first zones.

6. The carrier head of claim 1, further comprising 2 to 10 second zones.

7. The carrier head of claim 1, wherein there is a greater number of second zones than first zones.

8. The carrier head of claim 1, wherein the fluid-impermeable barriers are compressible.

9. The carrier head of claim 8, wherein the fluid-impermeable barriers are composed of an elastomer.

10. The carrier head of claim 9, wherein the elastomer comprises a rubber or silicone.

11. The carrier head of claim 8, wherein the fluid-impermeable barriers are portions of a closed-cell polymer pad.

12. The carrier head of claim 1, wherein the support plate has a flexural stiffness 0.1 to 1 times the flexural stiffness of a planar substrate formed of silicon and shaped to fit on the carrier head.

13. The carrier head of claim 1, wherein the support plate has a flexural stiffness 1 to 25 times the flexural stiffness of a planar substrate formed of silicon and shaped to fit on the carrier head.

14. The carrier head of claim 1, wherein the support plate has a flexural stiffness greater than 25 times the flexural stiffness of a planar substrate formed of silicon and shaped to fit on the carrier head.

15. The carrier head of claim 1, wherein the support plate is plastic.

16. A method of polishing a substrate, comprising:
   bringing a substrate held by a carrier head into contact with a polishing pad such that a plurality of fluid-impermeable barriers that project from a bottom of a support plate in the carrier head contact the substrate and divide a volume between the support plate and the substrate into a plurality of independently pressurizable second chambers;
   controlling pressure in a plurality of independently pressurizable first chambers defined by at least one upper barrier between the support plate and a housing of the carrier head so as to control flexure of the support plate in a plurality of first zones, wherein a region below each first zone is divided by the fluid-impermeable barriers into a plurality of second zones, with each second zone corresponding to a recess from a plurality of recesses at a bottom side of the fluid-impermeable barriers and at least one second zone of the plurality of second zones being entirely below an associated first zone of the plurality of first zones; and controlling pressure in the plurality of independently pressurizable second chambers below the support plate.

\* \* \* \* \*

UNITED STATES PATENT AND TRADEMARK OFFICE
CERTIFICATE OF CORRECTION

| | | |
|---|---|---|
| PATENT NO. | : 11,931,857 B2 | |
| APPLICATION NO. | : 17/350579 | |
| DATED | : March 19, 2024 | |
| INVENTOR(S) | : Steven M. Zuniga, Jay Gurusamy and Andrew J. Nagengast | |

It is certified that error appears in the above-identified patent and that said Letters Patent is hereby corrected as shown below:

In the Claims

In Column 7, Lines 58 and 59, Claim 1, delete "one or more" and insert -- a plurality of --.

In Column 8, Line 17, Claim 3, before "second" delete "the".

In Column 8, Line 18, Claim 3, after "recesses" insert -- with --.

Signed and Sealed this
Seventh Day of May, 2024

Katherine Kelly Vidal
*Director of the United States Patent and Trademark Office*